United States Patent [19]

Viikari et al.

[11] Patent Number: 4,982,163

[45] Date of Patent: Jan. 1, 1991

[54] METHOD AND A DEVICE FOR THE DETERMINATION OF THE CONDITION OF THE INSULATION OF AN OBJECT COATED WITH AN ELECTRIC INSULATION

[75] Inventors: Matti Viikari, Espoo; Mikko Hämäläinen, Helsinki, both of Finland

[73] Assignee: Aerius Oy, Espoo, Finland

[21] Appl. No.: 340,412

[22] PCT Filed: Aug. 26, 1987

[86] PCT No.: PCT/FI87/00107

§ 371 Date: Apr. 6, 1989

§ 102(e) Date: Apr. 6, 1989

[87] PCT Pub. No.: WO88/01748

PCT Pub. Date: Mar. 10, 1988

[30] Foreign Application Priority Data

Aug. 27, 1986 [FI] Finland ................... 863487

[51] Int. Cl.$^5$ ................... G01Y 3/11; G01R 31/08
[52] U.S. Cl. ................... 324/559; 324/557; 324/240
[58] Field of Search ............ 324/240, 329, 559, 263, 324/326, 327, 557, 558, 242, 241

[56] References Cited

U.S. PATENT DOCUMENTS

| | | | |
|---|---|---|---|
| 3,745,452 | 7/1973 | Osburn | 324/559 |
| 4,091,322 | 5/1978 | Stankoff | 324/329 |
| 4,134,061 | 1/1979 | Gudgel | 324/559 |
| 4,348,639 | 9/1982 | Karbowski | 324/329 |
| 4,390,836 | 6/1983 | Bruce | 324/559 |
| 4,438,389 | 3/1984 | DeSa | |
| 4,602,212 | 7/1986 | Hiroshima | 324/240 |
| 4,677,379 | 6/1987 | Arnaud | 324/240 |
| 4,799,010 | 1/1989 | Muller | 324/240 |

FOREIGN PATENT DOCUMENTS

| | | | |
|---|---|---|---|
| 1052559 | 3/1959 | Fed. Rep. of Germany. | |
| 1299183 | 12/1972 | United Kingdom | 324/329 |

Primary Examiner—Gerard R. Strecker
Assistant Examiner—Jose M. Solis
Attorney, Agent, or Firm—Nixon & Vanderhye

[57] ABSTRACT

The invention relates to a method for the determination of the condition of the insulation of an object (1) made of an electrically conducting material, coated with an electrical insulation (2) and positioned in an electrically conducting medium. According to the invention, the determination of the condition of the insulation is carried out without any electric contact with the object to be monitored in such a way that a first electromagnetic field (6) is created in the conducting medium (3), which field induces eddy currents (7, 8) both in the medium (3) and in the conducting object (1) positioned therein, a second electromagnetic field created by the eddy currents (7, 8) passing both in the conducting medium (3) and in the conducting object (1) is measured in the form of electrical information, essentially excluding the effect of the first electromagnetic field, and said electrical information is analyzed for detecting any changes in the condition of the insulation.

9 Claims, 1 Drawing Sheet

U.S. Patent
Jan. 1, 1991
4,982,163
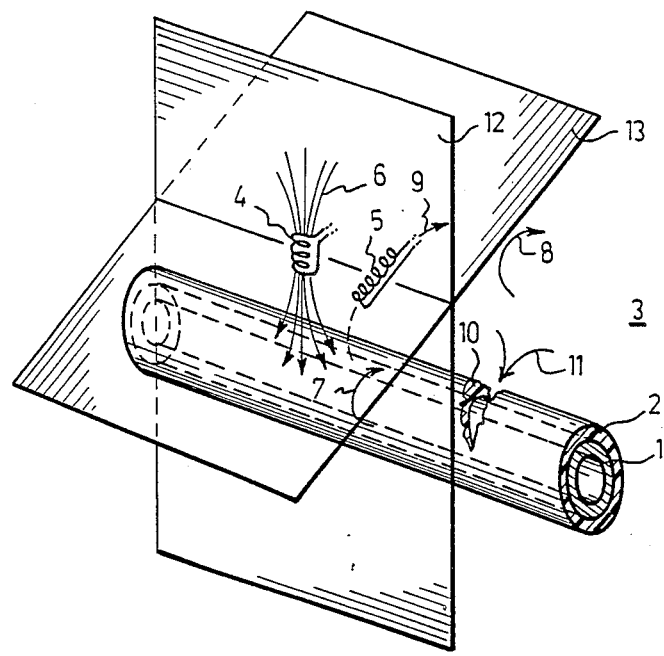
FIG. 1
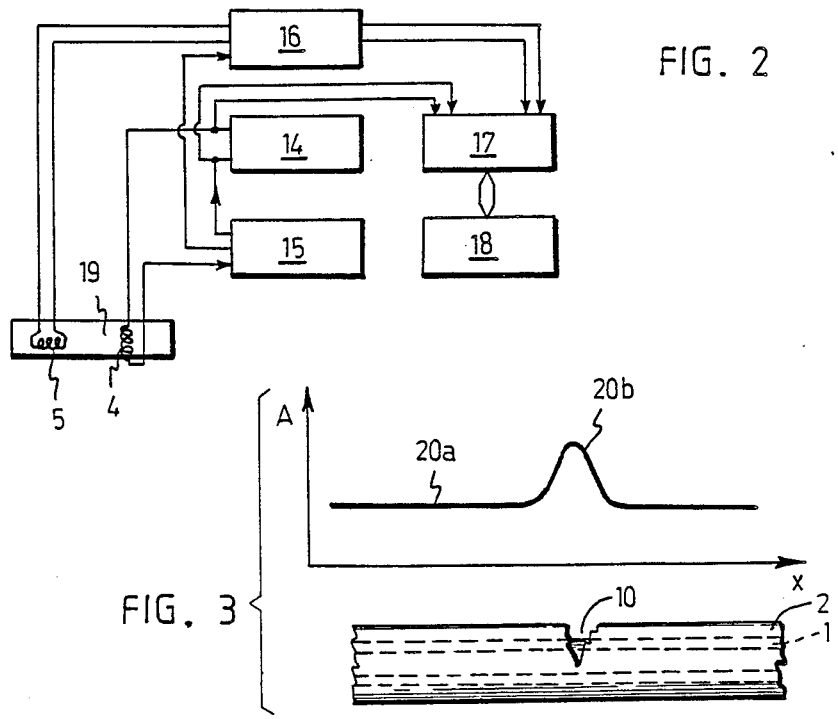
FIG. 2
FIG. 3

METHOD AND A DEVICE FOR THE DETERMINATION OF THE CONDITION OF THE INSULATION OF AN OBJECT COATED WITH AN ELECTRIC INSULATION

This invention relates to a method and a device for the determination of the condition of the insulation of an object made of an electrically conducting material, coated with an electric insulation and positioned in an electrically conducting medium. More specifically, it is possible by means of the method and the device according to the invention to monitor the condition of the electric insulation of electrically conducting objects, such as pipes and cables, within an electrically conducting medium such as sea water, and to locate the possible damages in the insulation.

Pipe systems and cables are frequently mounted in the ground, in water and on the bottom under the water, and these are insulated from the surroundings e.g. due to the electric currents flowing therein or for the prevention of corrosion. Very many of the insulations are also electric insulations, although this would not be the primary function of the insulation. The insulations may have been damaged already during the manufacture of the objects or they may be damaged later for various reasons. The condition of the insulations has to be checked often enough so that any damages occurring in the insulations could be repaired before the damage reaches the object to be protected. Moreover, the location of the damage has to be determined in order to be able to repair the insulation.

The condition of insulations of structures positioned in water can be monitored by means of methods based on the propagation of light waves, e.g. by visual appreciation made by a diver or by appreciating photographs. Such methods, however, are very slow, and it is difficult to find all damages by means thereof. Furthermore, the use of the method is extremely difficult if not impossible deep under the water or when checking underground objects.

The condition of an insulation can also be monitored by applying a direct or an alternating current to the object to be monitored, whereafter e.g. the potential field is measured around the object. According to U.S. Pat. No. 3,526,831, a power source is attached to the object to be examined, whereby measurements can be made in water only. According to European patent application No. 77,757, the measurement is carried out by means of a measuring sensor positioned between a feed electrode and the object to be examined.

In the method according to U.S. Pat. No. 4,365,191, leakage points can be located by measuring the potential difference between the object to be examined and an electrolyte such as sea water. The condition of the insulation of objects provided with sacrificing anodes as well as the operation of the anodes can be monitored e.g. as described in U.S. Pat. No. 4,228,399, whereby the contact to the object has to be maintained all the time, or without any contact as in U.S. Pat. No. 4,078,510.

Prior methods for monitoring the condition of insulations have many disadvantages. In certain methods an electric current has to be applied to the object to be monitored. In case of an object insulated on all sides this cannot be effected without damaging the insulation. Some methods are operative only with a cathodically protected object.

The object of the invention is to eliminate the disadvantages of the prior art and provide a versatile method and a device by means of which the condition of electrically conducting objects coated with an electric insulation and positioned within an electrically conducting medium can be monitored completely independently irrespective of the way of protection of the object. No physical contact with the object to be monitored is required, and the measurement can, within a usable measuring distance, be carried out even from outside the conducting medium.

The above objects of the invention can be achieved by means of a method according to the invention which is characterized in that a first electromagnetic field is created in the conducting medium, which field induces eddy currents both in the medium and in the conducting object positioned therein, a second electromagnetic field created by the eddy currents passing both in the conducting medium and in the conducting object is measured in the form of electrical information, essentially excluding the effect of the first electromagnetic field, and said electrical information is analysed for detecting any changes in the condition of the insulation. The second magnetic field is preferably measured within a narrow band at the frequency of the first magnetic field. In this way it can be ascertained that the measured second magnetic field really is the field caused by the eddy currents induced by the first magnetic field. On analysing the second magnetic field, the alternating voltage representing it is divided into two components, either into two amplitude components one of which coincides in phase with the first magnetic field and the other is 90° out of phase therewith, or into an amplitude component and its phase angle with respect to the first field.

The device according to the invention, in turn, is characterized in that it comprises a transmitting coil for creating a first electromagnetic field which induces eddy currents both in the medium and in the conducting object positioned therein; a receiving coil for receiving a second electromagnetic field created by the eddy currents passing both in the conducting medium and in the conducting object and for converting it into electric information; and an analysing device for analysing said electric information for detecting any changes in the condition. A phase-locked amplifier is preferably positioned between the receiving coil and the analysing device. For supplying phase data thereto, the amplifier is connected to a transmitter through a reference transformer. In this way it is possible to compare the phase of the received second magnetic field with that of the transmitted electromagnetic field and to divide it into components proportional thereto.

In the following the device and the method according to the invention will be described in more detail with reference to the attached drawings, wherein FIG. 1 is schematic view of a procedure according to the invention for detecting a damage in insulation of a pipe positioned in sea water, FIG. 2 is a block diagram of a measuring device according to the invention, and FIG. 3 illustrates an example of measuring results obtainable by means of the method according to the invention.

FIG. 1 shows a specific case in which the method and the device according to the invention can be applied. A pipe made of an electrically conducting material 1 and coated with an insulation 2 is immersed in sea water 3. A damage 10 has been formed in the insulation 2. The measuring device according to the invention, in turn, comprises a transmitting coil 4 and a receiving coil 5 which are positioned perpendicularly with respect to each other. It is to be mentioned that when the coils are so positioned with respect to each other the coil 5 cannot receive the magnetic field created by the coil 4. Accordingly, they are arranged in a so called zero connection. This kind of zero connection can also be effected by various other known coil geometries as well as by means of compensation coils or a compensator. As appears from FIG. 1, a current flowing through the transmitting coil 4 arranged perpendicularly above the pipe 1 to be examined creates a magnetic field in a plane 12 extending through the central axis of the pipe 1, the magnetic field being illustrated by the power lines 6. The field created by the transmitting coil 4 causes eddy currents 7 to be formed in the pipe 1 and eddy currents 8 in the sea water 3. These eddy currents 7 and 8, in turn, create a second electromagnetic field which according to the law of Lentz tends to counteract changes in the first magnetic field. This field is illustrated by the flux line 9 which penetrates the receiving coil 5. As appears from FIG. 1, the receiving coil 5 is positioned in a plane 13 which is perpendicular to the plane 12, which, in the middle point of the transmitting coil 4, extends parallel to the first electromagnetic field created by the transmitting coil 4. The second electromagnetic field created by the eddy currents 7 and 8 causes a voltage between the ends of the receiving coil 5. By analysing this electric information the condition of the insulation 2 can be monitored as described below.

FIG. 2 shows a block diagram of a specific arrangement of the device according to the invention. In FIG. 2, the transmitting coil 4 and the receiving coil 5 are arranged in a fixed coil stand 19 in order to maintain their mutual position as desired. The electric voltage created between the ends of the receiving coil 5, varying within the frequency range of the field transmitted by the transmitting coil 4, is applied to a phase-locked amplifier 16, which amplifies the received voltage and divides it into two components, either into two amplitude components one of which coincides in phase with the field transmitted by the transmitting coil 4 and the other is 90° out of phase therewith, or into an amplitude component and a phase angle component which indicates the phase angle of the received signal with respect to the transmitted signal. Information on the phase of the transmitted signal is supplied to the phase-locked amplifier from a reference transformer 15, through which the alternating current supplied to the transmitting coil 4 by a transmitter 14 passes. These two amplitude components or the amplitude component and the phase angle component are applied to a data logger 17 which is also connected to the power source 14 and the reference transformer 15 in order to apply the amplitude and the frequency of the supplied electromagnetic field to the data logger. The data logger 17 in turn is connected to a computer 18 for the analyse of the information collected by the data logger. Blocks 14 to 18 shown in the block diagram of FIG. 2 may be conventional commercially available devices. Thus the power source 14 may be e.g. an HP 201C function generator manufactured by Hewlett-Packard Inc., the phase locked amplifier may be of the type PAR Model 129A manufactured by Princeton Applied Research, and the data logger of the type HP 3421A (manufacturer Hewlet-Packard Inc.), and the computer 18 may be e.g. of the model HP 9816 (manufacturer Hewlet-Packard Inc.). The above structural parts, of course, have to be taken as examples, and they are by no means intended to restrict the scope of protection of the invention but merely to facilitate a more thorough understanding thereof.

FIG. 3 shows a specific case in which the measuring device according to the invention is displaceable around the pipe 1 coated with the insulation 2 which is damaged at a point 10. The reference A on the vertical axis represents a received signal which may be any of the above-mentioned four components of the measured second electromagnetic field, and the reference x on the horizontal axis represents the measuring point. When the measuring device according to the invention is displaced above the pipe 1, it is always possible to measure the magnetic field caused by the eddy currents formed both in the sea water and in the pipe 1 by the magnetic field created by the transmitting coil. The intensity of this field is relatively low. However, if the eddy currents induced in the sea water leak, as shown by leakage currents 11 in FIG. 1, into the pipe which has essentially better conducting properties than sea water, the eddy currents flowing in the pipe 1 are essentially intensified, whereby the magnetic field created thereby is considerably more intense than previously. In FIG. 3, this is illustrated by the curve portion 20b, whereas the signal produced by an undamaged pipe is indicated with the reference numeral 20a. This operation according to the invention requires that the eddy currents induced in the sea water or any conducting medium tend to be channelled through the possible damaged point of the insulation into another conductor. This, in turn, requires that this other conductor has essentially better conducting properties than the surrounding electrically conducting medium. This is the case between sea water and a pipe made of an electrically conducting material, such as iron, if the applied frequency varies within a suitable range. A suitable frequency range in this specific case would be the audio frequencies ranging from about 500 Hz to about 15 kHz. Of course, the method according to the invention is also operative within some other frequency ranges; in this specific case, however, it is within these frequency ranges that the difference between the conducting properties of sea water and the pipe is sufficient for even minor changes to be detected in the condition of the insulation.

The method according to the invention can be applied in various ways. For instance, the measuring results can be compared to values measured previously, possibly already in connection with the mounting of the pipe line, or changes occurring in the measuring results obtained in each particular case are evaluated. Practical tests have shown that damages in the insulation cause an extremely easily detectable change to take place in the signal to be measured; e.g., the sign of a component of the received field, being at a phase angle of 90° with respect to the transmitted field, may be reversed. Such a change is extremely easily detectable.

The method according to the invention can also be applied for locating a damaged point, e.g. by displacing the measuring arrangement perpendicular to the pipe in the direction of the pipe. The point of the maximal change of the received signal thereby indicates the damaged point of the insulation.

By means of the device according to the invention it is possible to monitor the condition of objects made of an electrically conducting material and coated with an electrical insulation when the object is partly or fully immersed in an electrically conducting medium, such as electrically conducting ground, water or when it is positioned on the bottom under the water, as well as to locate the damaged points. Also, it is easy by means of the device according to the invention to monitor the condition of the insulation of objects made of an electrically conducting material and partly or fully coated with an electrically non-conducting insulation by immersing the insulated portion of the object e.g. in an electrically conducting liquid and by measuring the electromagnetic field caused by the eddy currents.

We claim:

1. A device for the determination of the condition of the electrical insulation of an object made of an electrically conducting material, coated with an electrical insulation and positioned within an electrical conducting medium, comprising:
   a transmitting coil for creating a first electromagnetic field which induces eddy currents both in the medium and in the conducting object positioned therein;
   a receiving coil for receiving a second electromagnetic field created by the eddy currents passing both in the conducting medium and in the conducting object and oriented relative to said transmitting coil to effectively preclude direct measurement of said first electromagnetic field, said receiving coil generating an electrical signal in response to the measurement of said second electromagnetic field, said transmitting and receiving coils being movable along the object; and
   an analyzing device for analyzing said electrical signal to detect any changes in the condition of the insulation.

2. A device according to claim 1 further comprising a phase-locked amplifier positioned between said receiving coil and said analyzing device, a power source for said transmitting coil, a reference transformer for supplying phase data, said amplifier being connected to said power source through said reference transformer for supplying said amplifier with phase data.

3. A device according to claim 1 wherein said analyzing device comprises a data logger for collecting said electric signal and a computer attached to the data logger for processing said information.

4. A device according to claim 1 wherein said transmitting and receiving coils are oriented in said device substantially at right angles relative to one another.

5. A method for determining the condition of the electrical insulation of an object having an electrically conductive material, coated with an electrical insulation and positioned in an electrically conducting medium, by using a measuring device having transmitting and receiving coils displaceable relative to the object, comprising the steps of:
   creating by operating said transmitting coil, a first electromagnetic field in the conducting medium thereby inducing eddy currents both in the medium and in the conducting object positioned therein;
   displacing the measuring device relative to the object;
   creating a second electromagnetic field from said eddy currents passing both in the medium and in the conducting object;
   measuring said second electromagnetic field using said receiving coil while substantially excluding measurement of said first electromagnetic field;
   providing an electrical signal in response to the measurement of said second electromagnetic field; and
   analyzing said electrical signal to detect changes in the condition of the insulation.

6. A method according to claim 5 including measuring the second electromagnetic field within a narrow band at the frequency of the first magnetic field.

7. A method according to claim 5 wherein said electrical signal comprises an alternating voltage, and the step of analyzing includes dividing said alternating voltage into two components, one of which coincides in phase with the first field and the other of which is 90° out of phase therewith.

8. A method according to claim 5 wherein said electrical signal comprises an alternating voltage, and the step of analyzing includes dividing the alternating voltage into two components indicative of an amplitude and a phase angle as defined with respect to the first electromagnetic field.

9. A method according to claim 5 including orienting said transmitting and receiving coils substantially at right angles to one another whereby the measurement of the second electromagnetic field substantially excludes measurement of said first electromagnetic field.

* * * * *